(12) United States Patent
Su et al.

(10) Patent No.: US 10,199,260 B1
(45) Date of Patent: Feb. 5, 2019

(54) CONTACT HOLE STRUCTURE AND METHOD OF FABRICATING THE SAME

(71) Applicant: UNITED MICROELECTRONICS CORP., Hsin-Chu (TW)

(72) Inventors: Po-Wen Su, Kaohsiung (TW); Hsuan-Tai Hsu, Tainan (TW); Kuan-Hsuan Ku, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/726,358

(22) Filed: Oct. 5, 2017

(51) Int. Cl.
*H01L 21/768* (2006.01)
*H01L 29/417* (2006.01)
*H01L 23/522* (2006.01)
*H01L 21/311* (2006.01)

(52) U.S. Cl.
CPC .. *H01L 21/76805* (2013.01); *H01L 21/31116* (2013.01); *H01L 21/76807* (2013.01); *H01L 21/76843* (2013.01); *H01L 21/76858* (2013.01); *H01L 23/5226* (2013.01); *H01L 29/41766* (2013.01)

(58) Field of Classification Search
None
See application file for complete search history.

(56) References Cited

U.S. PATENT DOCUMENTS

| | | | |
|---|---|---|---|
| 9,466,678 B2 | 10/2016 | Huang | |
| 9,673,296 B2 | 6/2017 | Adam | |
| 9,859,393 B2 * | 1/2018 | Tak | H01L 29/4983 |
| 9,899,522 B1 * | 2/2018 | Liu | H01L 21/283 |
| 2011/0024801 A1 * | 2/2011 | Cheng | H01L 29/165 257/255 |
| 2014/0001561 A1 * | 1/2014 | Cheng | H01L 21/823807 257/369 |
| 2016/0181383 A1 * | 6/2016 | Huang | H01L 29/41758 257/757 |
| 2016/0233164 A1 * | 8/2016 | Choi | H01L 27/0924 |
| 2016/0343825 A1 * | 11/2016 | Bae | H01L 29/665 |
| 2017/0053916 A1 * | 2/2017 | Ching | H01L 27/0924 |
| 2017/0222014 A1 * | 8/2017 | Tak | H01L 23/485 |
| 2017/0323852 A1 * | 11/2017 | Hsu | H01L 21/76805 |

* cited by examiner

*Primary Examiner* — Lex H Malsawma
(74) *Attorney, Agent, or Firm* — Winston Hsu

(57) ABSTRACT

A method of fabricating a contact hole structure includes providing a substrate with an epitaxial layer embedded therein. Next, an interlayer dielectric is formed to cover the substrate. After that, a first hole is formed in the interlayer dielectric and the epitaxial layer. Later, a mask layer is formed to cover a sidewall of the first hole and expose a bottom of the first hole. Subsequently, a second hole is formed by etching the epitaxial layer at the bottom of the first hole and taking the mask layer and the interlayer dielectric as a mask, wherein the first hole and the second hole form a contact hole. Then, the mask layer is removed. Finally, a silicide layer is formed to cover the contact hole.

4 Claims, 4 Drawing Sheets

US 10,199,260 B1

CONTACT HOLE STRUCTURE AND METHOD OF FABRICATING THE SAME

BACKGROUND OF THE INVENTION

1. Field of the Invention

The present invention relates to a contact hole structure, and more particularly to a contact hole in the shape of a pacifier nipple.

2. Description of the Prior Art

Integrated circuits (ICs) are fabricated on wafers. Commonly, these wafers are semiconductor materials; for example, silicon. Research and development has seen a decrease in the size of the transistors making up the integrated circuits.

As transistor sizes shrink, the contact area between the source and drain regions and a metal contact plug for communicating with the transistor decreases proportionally. Contact resistance of the source and drain regions increases proportionally with the decrease in the contact area. Thus, smaller contact areas lead to higher contact resistances. The contact resistance is parasitic and degrades performance of the MOSFET. A portion of the contact resistance results from a Schottky barrier between the metal contact plug and the source/drain regions.

SUMMARY OF THE INVENTION

Accordingly, there is a need for an improved fabrication process and structure that lowers the Schottky barrier without compromising the area of the source and drain regions, in order to improve device performance.

According to a preferred embodiment of the present invention, a contact hole structure comprises a substrate. An epitaxial layer is embedded within the substrate. A contact hole is disposed in the epitaxial layer, wherein the contact hole is in the shape of a nipple of a pacifier. A silicide layer fills in the contact hole.

According to another preferred embodiment of the present invention, a method of fabricating a contact hole structure comprises providing a substrate with an epitaxial layer embedded therein. Next, an interlayer dielectric is formed to cover the substrate. After that, a first hole is formed in the interlayer dielectric and the epitaxial layer. Later, a mask layer is formed to cover a sidewall of the first hole and expose a bottom of the first hole. Subsequently, a second hole is formed by etching the epitaxial layer at the bottom of the first hole and taking the mask layer and the interlayer dielectric as a mask, wherein the first hole and the second hole form a contact hole. Then, the mask layer is removed. Finally, a silicide layer is formed to cover the contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a method of method of fabricating a contact hole structure according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
and
FIG. 7 is a fabricating stage following FIG. 6.

DETAILED DESCRIPTION

Figure 1:
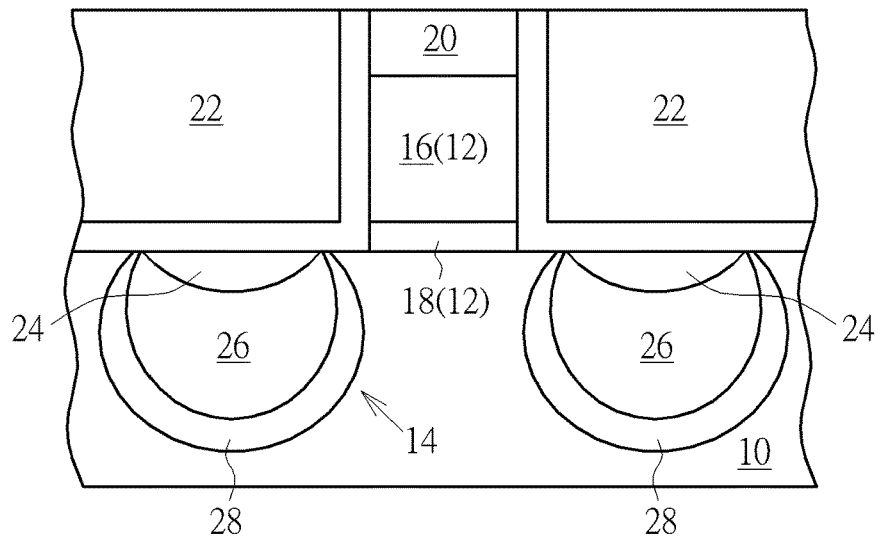

FIG. 1 to FIG. 7 depict a method of method of fabricating a contact hole structure according to a preferred embodiment of the present invention. As shown in FIG. 1, a substrate 10 is provided. A gate structure 12 is formed on the substrate 10. Two epitaxial layers 14 are respectively embedded within the substrate 10 at two sides of the gate structure 12. The gate structure 12 includes a gate electrode 16, and a gate dielectric layer 18. A cap 20 may cover the gate structure 12. An interlayer dielectric 22 covers the substrate 10. The substrate 10 of the present invention may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate.

The gate electrode 16 may be doped polysilicon or metal. The gate dielectric layer 18 may be silicon oxide, silicon nitride, silicon carbide nitride, silicon oxynitride, silicon carboxynitride, high-k dielectrics or a combination thereof. Each of the epitaxial layers 14 may be a single layer formed by a stressed material such as silicon germanium (SiGe), silicon phosphorus (SiP), or silicon carbide (SiC). Each of the epitaxial layers 14 may also be a multiple layer including a cap layer 24, a stress material 26 and a buffer layer 28. According to a preferred embodiment of the present invention, the buffer layer 28 is silicon, the stress material 26 is SiGe, and the cap layer 24 is silicon. The interlayer dielectric 22 may be silicon nitride, silicon oxide, silicon oxynitride or another insulating layer.

Figure 2:
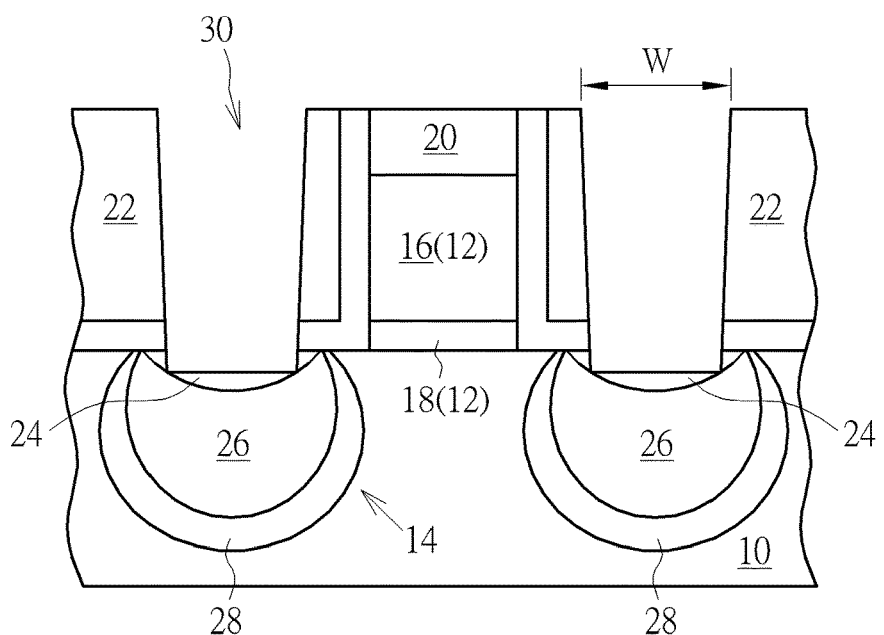
Figure 3:
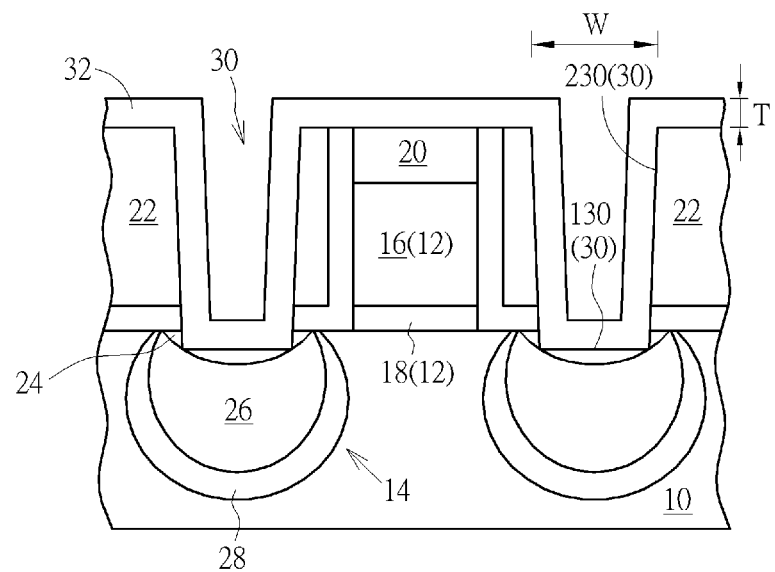

As shown in FIG. 2, the interlayer dielectric 22 and the epitaxial layers 14 are etched to form a first hole 30 penetrating the interlayer dielectric 22 and part of the epitaxial layers 14. In this embodiment, there are two first holes 30 respectively on the two epitaxial layers 14. The first hole 30 has a width W. As shown in FIG. 3, a mask layer 32 is formed to conformally cover the interlayer dielectric 22 and the first holes 30. In detail, the mask layer 32 contacts a bottom 130 and a sidewall 230 of each of the first holes 30. The mask layer 32 may be a carbon-containing layer or other material which has a different etch ratio from the interlayer dielectric 22. According to a preferred embodiment of the present invention, the mask layer 32 may be hydrocarbon. Furthermore, a thickness T of the mask layer 22 is about ¼ of the width W.

Figure 4:
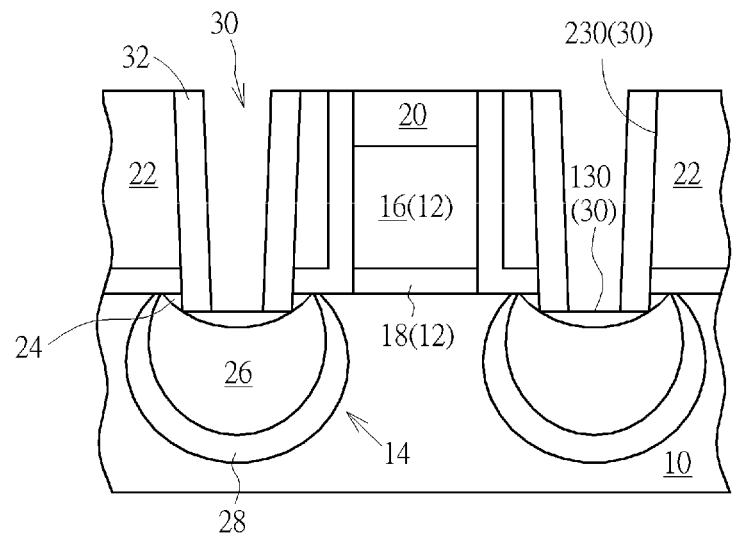
Figure 5:
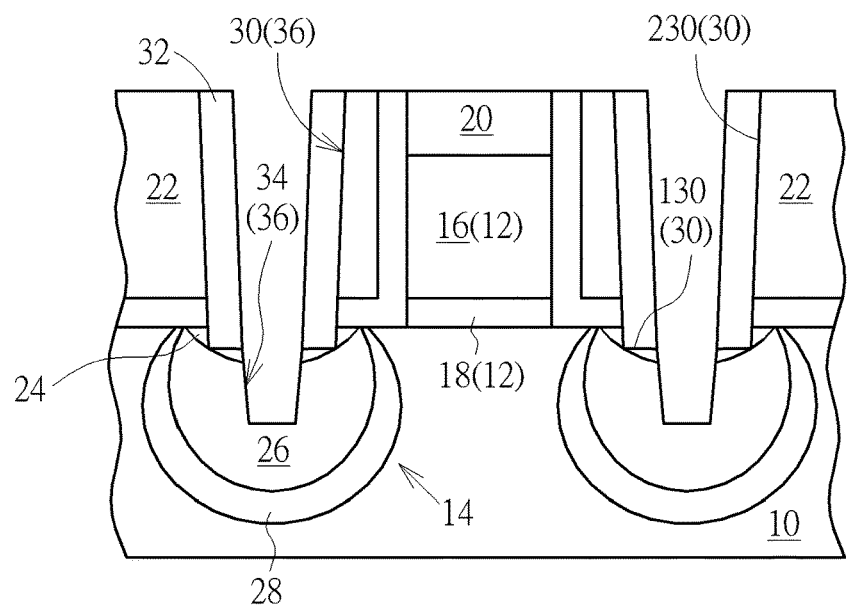

As shown in FIG. 4, the mask layer 32 is anisotropically etched to remove the mask layer 32 on the bottom 130 of the first hole 30 and on the top surface of the interlayer dielectric 22. The remaining mask layer 32 will only be on the sidewall 230 of the first hole 30. The anisotropical etching process may be a dry etching using oxygen plasma. As shown in FIG. 5, a second hole 34 is formed by etching the substrate 10 at the bottom 130 of the first hole 30 and taking the remaining mask layer 32 and the interlayer dielectric 22 as a mask. The first hole 30 and the second hole 34 form a contact hole 36.

Figure 6:
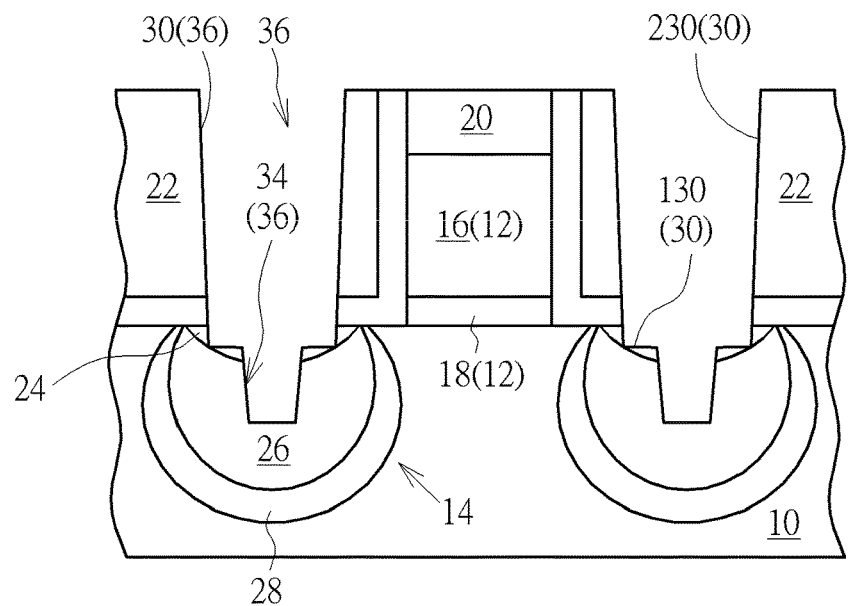
Figure 7:
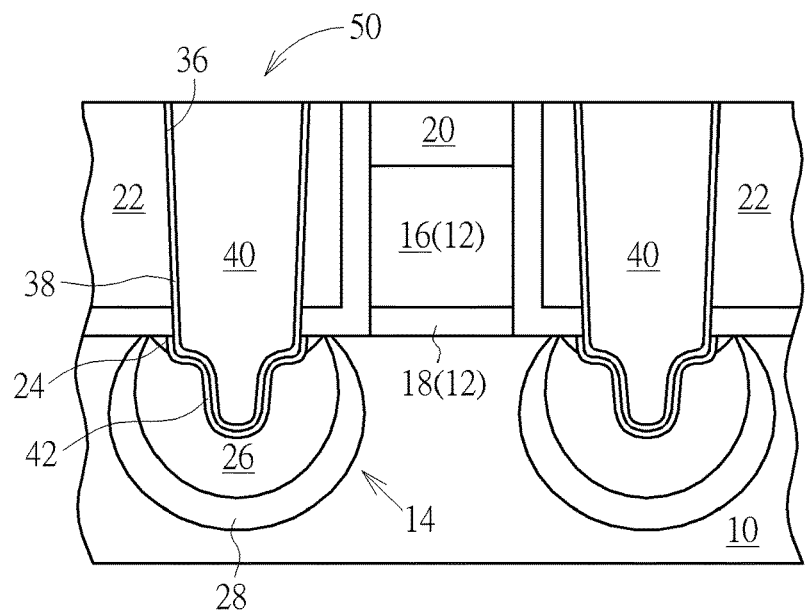

As shown in FIG. 6, the mask layer 32 is removed entirely. It is noteworthy that the contact hole 36 at the epitaxial layer 14 is in the shape of a step. As shown in FIG. 7, a barrier layer 38 is formed in the contact hole 36. Then, a conductive layer 40 fills in the contact hole 36. The barrier layer 36 may be titanium (Ti), titanium nitride (TiN), titanium tungsten nitride (TiWN) or tungsten nitride (WN). The conductive layer 40 may be tungsten (W), aluminum (Al) or other metals. According to a preferred embodiment of the present invention, the barrier layer 38 is TiN/Ti, and the conductive layer is W. After that, the barrier layer 38 is heated to transform part of the barrier layer 38 into a silicide layer 42. In this embodiment, the silicide layer 42 is titanium silicide (TiSi). During the process of transforming the barrier layer 38, part of the substrate 10 is consumed to be transformed into the silicide layer 42. Therefore, the step-shaped contact hole 36 resembles a nipple of a pacifier. At this point, a contact hole structure 50 of the present invention is completed.

Please refer to FIG. 7. According to a preferred embodiment of the present invention, a contact hole structure 50, includes a substrate 10. An epitaxial layer 14 is embedded in the substrate 10. An interlayer dielectric 22 covers the substrate. A contact hole 36 is disposed in the interlayer dielectric 22 and part of the epitaxial layer 14. It is noteworthy that the contact hole 36 includes the shape of a pacifier nipple. A silicide layer 42 such as TiSi is disposed in the contact hole 36 in the epitaxial layer 14. A barrier layer 38 such as TiN/Ti is disposed in the contact hole 36. The conductive layer 40 such as W is also disposed in the contact hole 36. The conductive layer 40 in the contact hole 36 within the epitaxial layer 14 is also in the shape of a pacifier nipple. The epitaxial layer 14 may be a multiple layer including a buffer layer 28 such as silicon, a stress material 26 such as SiGe, and a cap layer 24 such as silicon.

A gate structure 12 is disposed on the substrate 10. The gate structure 12 is at a side of the epitaxial layer 14. The gate structure 12 includes a gate electrode 16, and a gate dielectric layer 18. A cap 20 may cover the gate structure 12. The gate electrode 16 may be doped polysilicon or metal. The gate dielectric layer 18 may be silicon oxide, silicon nitride, silicon carbide nitride, silicon oxynitride, silicon carboxynitride, high-k dielectrics or any combination thereof.

Figure 8:
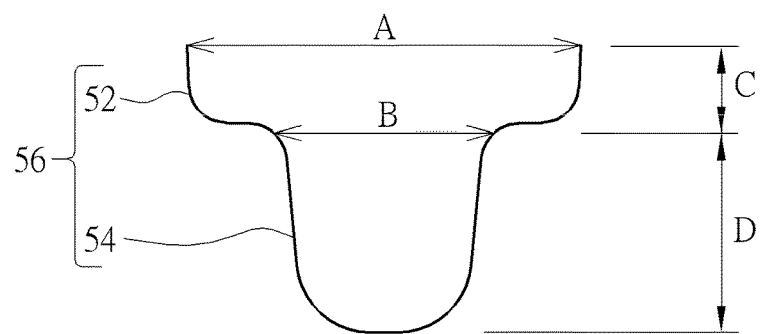
FIG. 8 shows an enlarged view of an outline of the contact hole within the epitaxial layer of FIG. 7.

FIG. 8 shows an enlarged view of an outline of the contact hole within the epitaxial layer of FIG. 7. As shown in FIG. 8, the nipple 56 of the pacifier includes a nipple bottom 52 and a nipple tip 54. A first width A of the nipple bottom 52 is greater than a second width B of the nipple tip 54, and a ratio of the first width A to the second width B is between 1.4 and 3.3. Furthermore, the nipple bottom 52 has a first length C, the nipple tip 54 has a second length D, and a ratio of the first length C to the second length D is between 0.17 and 0.4.

The present invention utilizes two etching process to form the contact hole and, via the mask layer, makes the contact hole step-shaped. After forming the barrier layer and the conductive layer, the shape of the contact hole in the epitaxial layer resembles a nipple of a pacifier. Therefore, the conductive layer in the contact hole will also be in the shape of a pacifier nipple. Due to the special shape of the conductive layer, the conductive layer has a large contact area between the epitaxial layer. In this way, the Schottky barrier between the conductive layer and the epitaxial layer is decreased, and the resistance between the conductive layer and the epitaxial layer can be reduced. Furthermore, even though some of the epitaxial layer is lost to form the contact hole, the epitaxial layer still retains enough area to serve as source/drain regions for the gate structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a contact hole structure, comprising:
   providing a substrate with an epitaxial layer embedded therein;
   forming an interlayer dielectric covering the substrate;
   forming a first hole in the interlayer dielectric and the epitaxial layer;
   forming a mask layer covering a sidewall of the first hole and exposing a bottom of the first hole;
   forming a second hole by etching the epitaxial layer at the bottom of the first hole and taking the mask layer and the interlayer dielectric as a mask, wherein the first hole and the second hole form a contact hole;
   after forming the contact hole, removing the mask layer entirely; and
   forming a silicide layer covering the contact hole.

2. The method of fabricating a contact hole structure of claim 1, further comprising:
   forming a conductive layer in the contact hole.

3. The method of fabricating a contact hole structure of claim 1, wherein before forming the silicide layer, the contact hole is in a shape of a step.

4. The method of fabricating a contact hole structure of claim 1, wherein after forming the silicide layer, the contact hole in the epitaxial layer has an inner surface comprising a convex curved portion and a concave curved portion, and the inner surface directly contacts the silicide layer.

* * * * *